United States Patent [19]
Fox et al.

[11] Patent Number: 5,347,222
[45] Date of Patent: Sep. 13, 1994

[54] SIGNAL/NOISE RATIO OPTIMIZATION TUNING SYSTEM

[75] Inventors: Timothy R. Fox, Chicago; Richard J. Faehnrich, Niles, both of Ill.

[73] Assignee: Kabushiki Kaisha Toshiba, Kanagawa, Japan

[21] Appl. No.: 2,795

[22] Filed: Jan. 11, 1993

[51] Int. Cl.$^5$ .............................................. G01V 3/00
[52] U.S. Cl. ................................... 324/322; 333/17.3
[58] Field of Search ............... 324/322, 318, 314, 309, 324/307, 300; 333/17.3, 17.2; 334/30, 31; 330/1 R, 1 A, 2, 3

[56] References Cited
U.S. PATENT DOCUMENTS

| | | | |
|---|---|---|---|
| 4,882,541 | 11/1989 | Haragashira | 333/17.3 |
| 4,950,993 | 8/1990 | Encellaz et al. | 324/322 |
| 5,208,537 | 5/1993 | Rietsch et al. | 324/322 |
| 5,258,718 | 11/1993 | Duerr | 324/322 |

Primary Examiner—Louis Arana
Attorney, Agent, or Firm—Finnegan, Henderson, Farabow, Garrett & Dunner

[57] ABSTRACT

A signal/noise ratio optimization tuning system, which can be used for tuning receiver antennas in Magnetic Resonance Imaging receiver systems, has a switch-controlled noise source means that is weakly coupled to the receiver antenna. The switch-controlled noise source switches a noise source between higher and lower power states at a predetermined frequency. A noise power meter means, which is synchronized to the switch-controlled noise source means, measures outputs of the receiver antenna. The noise power meter means measures the outputs of the receiver antenna when the noise source is switched between higher and lower power states and computes a ratio of the receiver antenna output with the noise source in the higher power state to the receiver antenna output with the noise source in the lower power state to obtain a noise power ratio. The tuning adjustment means is varied to maximize this noise power ratio.

13 Claims, 5 Drawing Sheets

SIGNAL/NOISE RATIO OPTIMIZATION TUNING SYSTEM

BACKGROUND OF THE INVENTION

The present invention relates to a system for tuning a receiver antenna circuit and amplifier to maximize the signal/noise ratio and, more particularly, to a system for tuning a receiver antenna circuit and amplifier in a Magnetic Resonance Imaging (MRI) system.

In a typical MRI system, the signal voltage is produced by a resonant antenna circuit that drives a low-noise amplifier. The antenna senses the rotating magnetization inside a test sample, such as a patient, from a nuclear magnetic resonance (NMR) procedure. Typically, the rotation frequency is in the high frequency range of between approximately one to 100 MHz. The frequency depends on the magnetic field strength in the MRI system.

The antenna circuit in an MRI system typically contains a tuning adjustment, such as a variable capacitor. For example, a resonant antenna can be a simple coil, or inductor, surrounding or adjacent the sample to be tested. The antenna is tuned by an external capacitor which forms an "RLC" resonant circuit.

FIG. 1 illustrates such a circuit, having inductance L, capacitance C and loss resistance R. The rotating magnetization induces an electromotive force (emf) E in series with the inductance L and the voltage across the capacitance C drives the amplifier. The circuit will resonate at the operating frequency $f_o$ when the capacitor is adjusted to satisfy equation 1 given as:

$$1/\omega_o C = \omega_o L \text{ where } \omega_o = 2\pi \times f_o \quad (1)$$

This adjustment is called tuning.

The loss resistance R shown in FIG. 1 is the actual resistance of the circuit elements, inductor L and capacitance C, and the loss coupled from the conductivity and dielectric loss of the test sample located within the field of the coil. In the circuit of FIG. 1, the signal is produced by the emf E and the noise is produced by the thermal noise $e_R$ in resistance R at room temperature. The input signal to the amplifier is maximized approximately when the circuit is tuned to resonate as in Equation 1.

To maximize the signal/noise ratio of the system, the loss in the MRI receiver antenna must be minimized. The loss of the receiver antenna is defined as the dissipation as heat of the energy stored in the resonant circuit. This heat dissipation is lost energy to the receiver system. Some of the loss comes from the current induced in the test sample, and this loss cannot be reduced without reducing the volume of the test sample coupled to the coil. The remaining loss of the system is produced from the wire in the coil and the unwanted resistance of the tuning capacitors and other components that form the total antenna circuit. This loss is expressed in terms of a "quality factor" (Q). Q is inversely related to the loss; a high Q resonant circuit dissipates very little of its stored energy in one cycle of the oscillating current. Moreover, the Q determines the bandwidth of the resonant circuit. A high Q resonant circuit has a narrow bandwidth. If the Q of the tuned circuit is high, the difference between the maximum output and the resonant tuning conditions is negligible. Therefore, the tuning condition results in the maximum output from the amplifier.

In the circuit of FIG. 1, the noise generator of the resistance R is in series with the signal generator E, and thus, the noise voltage input to the amplifier will see the same gain factor as the signal voltage. Therefore, the signal/noise ratio will not change with the tuning adjustment because there is no amplifier noise to consider in this circuit. The circuit is tuned merely to maximize the signal level of the amplifier.

FIG. 2 illustrates a noisy amplifier used with the RLC tuned circuit. The amplifier noise is shown as noise voltage generator $e_n$ having a constant magnitude. The amplifier noise $e_n$ is in series with the high-impedance amplifier input. In this case, to maximize the signal/noise ratio, the signal level at the amplifier input must be maximized. The signal/noise ratio of the FIG. 2 circuit is maximized when equation 1 is satisfied by adjusting capacitor C, which also gives maximum signal output from the amplifier.

Capacitor C is adjusted either manually or automatically by computer software. The procedure uses either a constant signal coupled to the antenna from a signal generator at the operating frequency or a repeated NMR signal from the actual MRI system. If the noise voltage $e_n$ of the amplifier is very small, the signal/noise ratio will be a weak function of the tuning and precision in the adjustment of the capacitor is not necessary.

FIG. 3 illustrates a more realistic model of a noisy amplifier connected to an RLC resonant circuit. The amplifier has input noise voltage, $e_n$, input noise current, $i_n$, and input impedance, $R_{in}$. In this model, the input impedance $R_{in}$ is not a noise source. All of the noise generated by the amplifier in this model is produced by the two generators $e_n$ and $i_n$. This circuit differs from the circuit of FIG. 2 in that the amplifier noise generated in the FIG. 3 circuit is affected by tuning.

The contribution of the noise current generator to the total noise voltage is a function of the source impedance seen by the amplifier terminals. The amplifier input impedance also affects the quality factor, Q, of the tuned circuit. If the amplifier input impedance is made very low there will be a large difference between the tuning condition for the maximum signal level of the amplifier and the tuning condition for the best signal/noise ratio. This tuning shift can have a great effect on the signal/noise ratio if the amplifier input impedance results in a large reduction of the resonant circuit Q.

FIG. 4 illustrates a commonly used method to tune a receiver amplifier for the best signal/noise ratio. The tuning capacitor C of FIG. 3 is replaced by a more complicated capacitor network that has two separate adjustments, $C_{tune}$ and $C_{match}$. With these two degrees of freedom, the output impedance of the resonant network at the connection port can be adjusted over a wide range of complex values, and is typically adjusted to 50 ohms (real) at the operating frequency $f_o$. The amplifier connected to this port is pre-adjusted to give the best signal/noise ratio from a 50 ohm source impedance. To tune this system, $C_{tune}$ and $C_{match}$ are adjusted to give 50 ohms (real) at the connection port, as measured with a suitable impedance meter. After this adjustment is made, the connection port is connected to drive the amplifier. These adjustments do not necessarily result in the maximum signal at the amplifier output, but they do result in the best signal/noise ratio.

A problem exists with this method of tuning for best signal/noise ratio because it requires a 50 ohm system and an external impedance meter. Furthermore, the connection port must be changed or switched between the tuning adjustment and actual operation of the receiver antenna. At this very sensitive point in the circuit, connectors and switches can be unreliable, and may introduce noise or interference into the circuit.

In some receiver systems, the input impedance of the amplifier is adjusted with feedback to obtain a desired value of Q for the resonant circuit. This is known as "Q damping". Q damping requires a direct connection between the tuned circuit and the amplifier, and it is not usually possible to transform the impedance at the connector port to 50 ohms. If the desired Q value is very low, to reduce the effect of coupling between several tuned circuits, the tuning shift between maximum signal level of the amplifier and best signal/noise condition may be substantial and the signal/noise ratio may be too low when the antenna circuit is tuned for the maximum signal level.

SUMMARY OF THE INVENTION

Accordingly, it is an object of the invention to provide a signal/noise ratio optimization tuning system that does not require the disconnection of the amplifier.

It is another object of the present invention to provide a signal/noise optimization tuning system that can be used on any system of resonant antenna and amplifier with one adjustable tuning adjustment.

The objects given above are accomplished by using a switch-controlled noise source weakly coupled to a receiver antenna and a suitable noise power meter to measure the noise at an amplifier output in a narrow bandwidth centered on an operating frequency.

To achieve these objects and in accordance with the purpose of the invention, as embodied and as broadly described herein, a signal/noise ratio optimization tuning system for tuning a receiver antenna circuit and amplifier comprises a switch-controlled noise source means weakly coupled to the receiver antenna circuit during tuning operations for switching a noise source between higher and lower power states at a suitable frequency; a noise power meter means synchronized to the switch-controlled noise source means for measuring outputs of the amplifier, wherein the noise power meter means measures the outputs of the amplifier when the noise source is switched between higher and lower power states and computes a ratio of the amplifier output with the noise source in the higher power state to the amplifier output with the noise source in the lower power state to obtain the ratio of a hot and cold output power values, respectively; and tuning adjustment means for tuning the receiver antenna circuit and amplifier to maximize the ratio of amplifier outputs with the noise source in the higher and lower power states by making an adjustment to the receiver antenna circuit.

The accompanying drawings, which are incorporated in and constitute a part of the specification, illustrate an embodiment of the invention and, together with the description, serve to explain the principles of the invention.

DESCRIPTION OF THE PREFERRED EMBODIMENTS

Figures 1, 2:
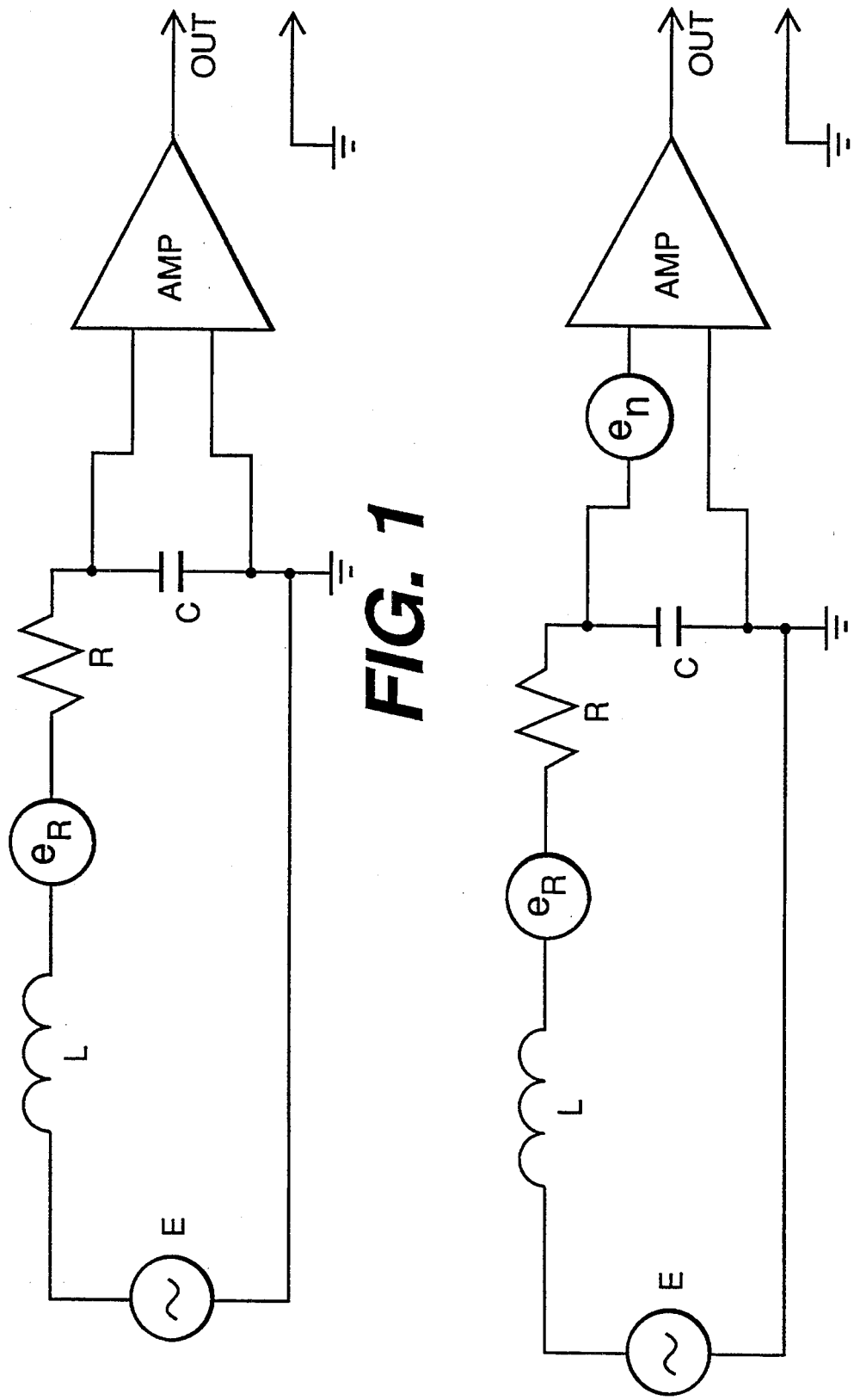
FIG. 1 is a schematic diagram illustrating a simplified NMR receiver antenna circuit.
FIG. 2 is a schematic diagram of an NMR receiver antenna circuit with amplifier noise.
Figure 3:
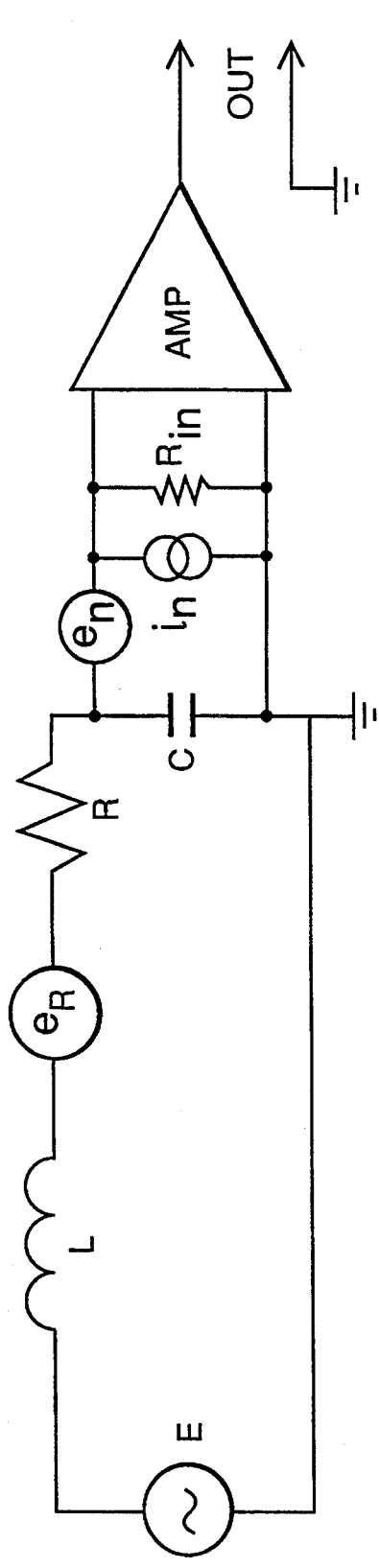
FIG. 3 is an NMR receiver antenna circuit including amplifier input noise generators and input impedance.
Figure 4:
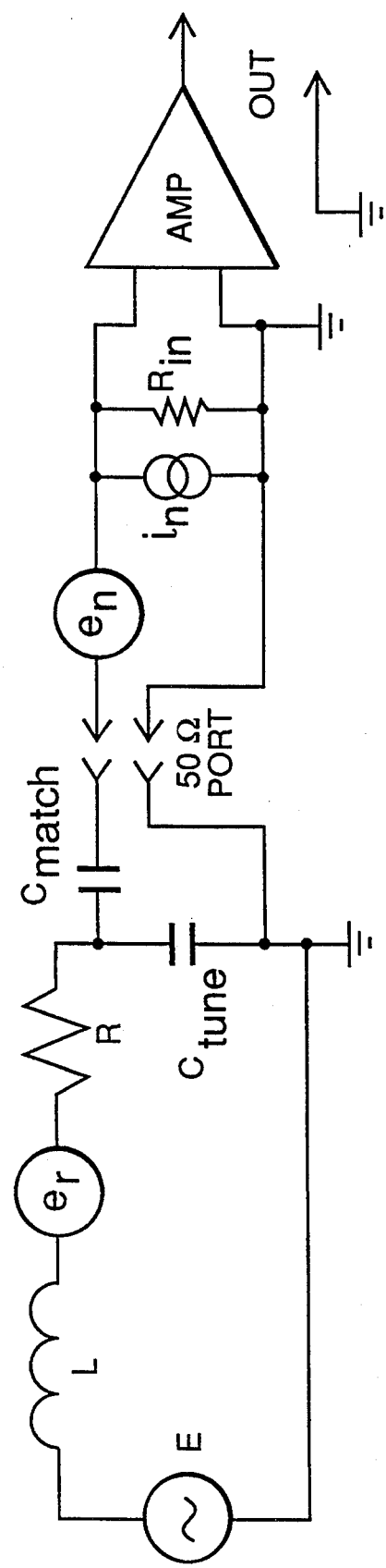
FIG. 4 is a schematic diagram of an NMR receiver antenna circuit employing impedance matching to amplifier input.

Reference will now be made in detail to the presently preferred embodiments of the invention, examples of which are illustrated in the accompanying drawings. Throughout the drawings, like reference characters are used to indicate like elements.

Figure 5:
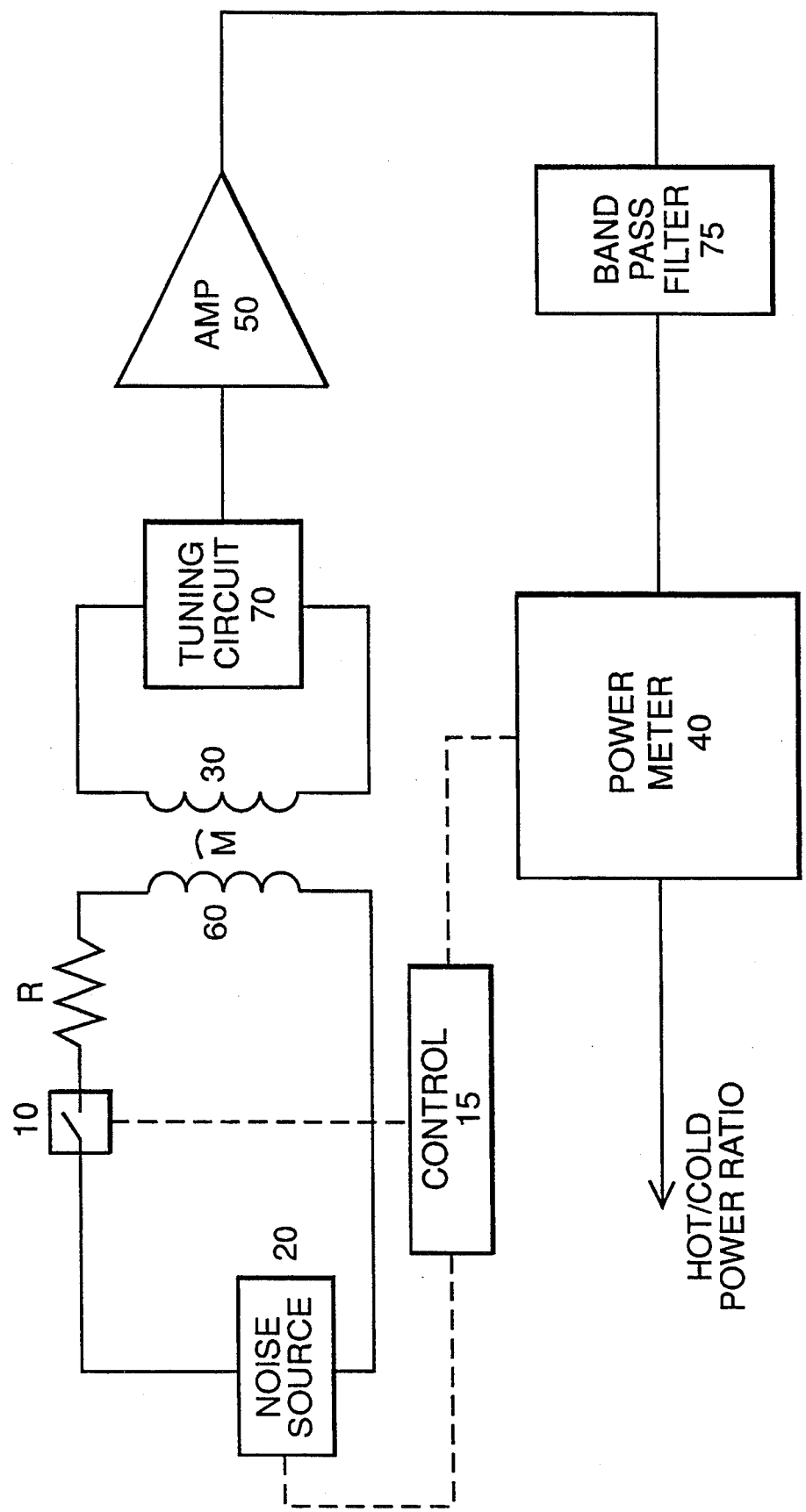
FIG. 5 is a schematic diagram that illustrates a first embodiment of the signal/noise ratio optimization tuning system according to the present invention.

A preferred embodiment of the signal/noise ratio optimization tuning system according to the present invention is shown in FIG. 5. Diode in noise source 20 is switched on and off via control 15 and switch 10 also is switched on and off by control 15. Noise source 20 is weakly coupled to antenna 30. The noise power meter 40 measures the noise at amplifier 50 output in a narrow bandwidth centered on the operating frequency by bandpass filter 75.

The system of the present invention automatically switches noise source 20 on and off between hot and cold states, respectively. Noise power meter 40 is synchronized to the noise source switching and measures the amplifier 50 output power values for the hot and cold states, averages each power value over time, and computes a ratio of the hot and cold output power values. The best signal/noise ratio corresponds to the highest ratio of the hot output power value divided by the cold output power value.

Tuning circuit 70 is adjusted to achieve maximum signal/noise ratio. As tuning is adjusted via tuning circuit 70, both the hot and cold output power values of amplifier 50 change. Therefore, noise source 20 must be switched at a suitable frequency that is high compared with the tuning adjustment speed. This high frequency can be 2-20 Hz. Other frequencies for noise source switching may be employed, and are within the scope of the present invention.

Tuning circuit 70 may make more than one adjustment to achieve maximum signal/noise ratio. A suitable algorithm procedure needed to tune the circuit by adjusting more than one component is considered to be apparent to those skilled in the art and is within the scope of the present invention.

Noise source 20 is weakly coupled to antenna 30 so as not to affect the tuning. Weak coupling is achieved, for example, by mounting a small coupling coil 60 a large distance from the antenna 30. Other means for achieving weak coupling between noise source 20 and antenna 30 are within the scope of the present invention. The weak coupling of noise source 20 to antenna 30 depends on a coupling factor, which is a function of mutual inductance M and coil inductances between coupling coil 60 and antenna 30. The coupling is not a factor of the power applied to coupling coil 60. Therefore, a very weak coupling can be used. If the coupling is very weak, it may be necessary to amplify the output of the noise source to increase the noise power applied to the coupling coil. The receiver system output noise must be measurably higher when the noise source is in the higher noise state than when the noise source is in the lower noise state. Therefore, the system design must couple enough noise power from the noise source to the antenna to give a total noise power in the antenna larger than the inherent noise of the antenna.

Noise source 20 must be totally disabled from the receiver system when not in use. When totally disabled, noise source 20 does not degrade the signal/noise ratio witch extraneous noise during normal operation of the receiver system.

Figure 6:
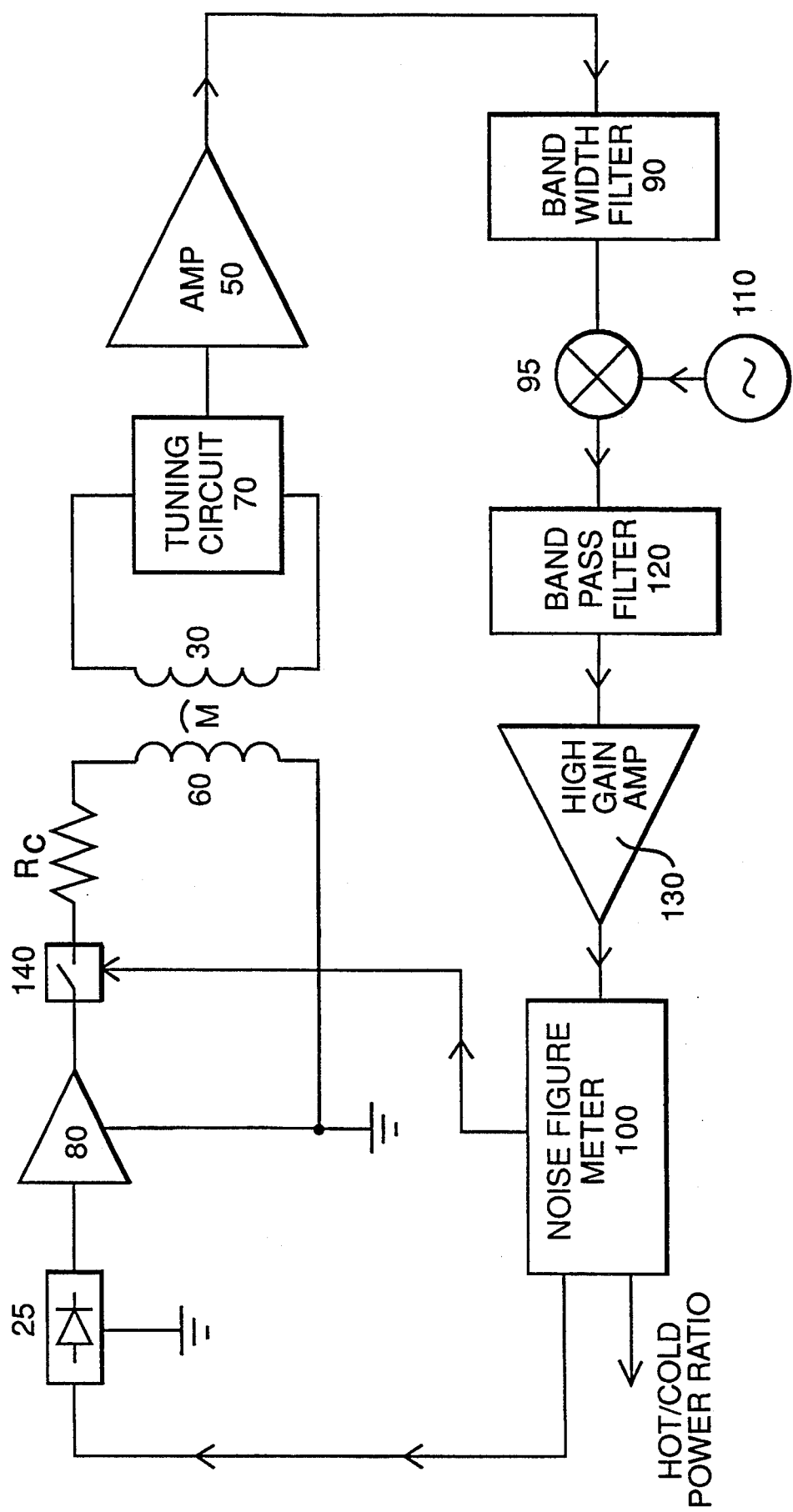
FIG. 6 is a schematic diagram illustrating an experimental tuning system according to the embodiment of the present invention.

FIG. 6 illustrates an experimental set-up of the embodiment of the signal/noise ratio optimization tuning system of the present invention. Noise source 25 is a solid-state diode noise source switched at about 10 Hz between hot and cold states. Noise source 25 is designed to test 50 ohm amplifiers and supplies a specified low level of excess noise when the diode is on. When the diode is off, the noise source acts as a 50 ohm resistance at room temperature. Other noise sources may be employed and are within the scope of the present invention.

Noise figure meter 100 is designed to switch noise source 25 at about 10 Hz. The bandwidth of noise figure meter 100 is wide, about 4 MHz, which is much wider than the bandwidth for an MRI system, which is approximately 20 kHz. Other means of switching noise source 25 may be employed and are within the scope of the present invention. A high-gain amplifier 80 follows noise source 25 to increase the total noise power applied to coupling coil 60. Amplifier 80 must have a low noise figure so that the output noise will change by a large ratio between the hot and cold states of noise source 25. Following amplifier 80, coupling coil 60 is weakly coupled to antenna 30.

The present invention, as embodied in FIG. 6 also includes bandwidth filter 90, heterodyne mixer 95, tuning oscillator 110, band-pass filter 120 and low-noise amplifier 130 following amplifier 50. Bandwidth filter 90 has a passband centered approximately on the operating frequency, thus eliminating a response at the "image" frequency before heterodyne mixer 95 input. Band-pass filter 120 is a fixed-center-frequency band-pass filter. A fixed-frequency bandpass filter 120 is used because narrow-band filters are usually hard to tune. The heterodyne mixer 95 mixes the input signal with the tuning oscillator 110 in the normal manner to obtain an output frequency at the sum or difference of the input frequency and the tuning oscillator frequency. The frequency of the tuning oscillator 110 is chosen to shift the operating frequency $f_o$ to the center frequency of the band-pass filter 120.

For example, a wide selection of narrow-band filters at 10.70 MHz center-frequency is commercially available. If the operating frequency of the system is 21.28 MHz, then tuning oscillator 110 is set to 10.70 MHz plus 21.28 MHz, or 31.98 MHz. Noise figure meter 100 is tuned to the same 10.70 MHz frequency, but the actual pass-band is determined by the external band-pass filter 120. The narrow pass-band greatly reduces the total noise power, therefore high-gain low-noise amplifier 130 is added between bandpass filter 120 output and noise figure meter 100 input to increase the noise power to a measurable value.

Noise figure meter 100 can be obtained commercially; for example, Hewlett-Packard model no. 8970B can be used. This commercial unit can be set to switch the noise source between the hot and cold states, measure separately the output noise power in the hot and cold states, compute the average value of the output noise power in each of the hot and cold states, and display the ratio of the average values of noise power in the hot and cold states. The operator of the system can observe the displayed ratio of the noise power ratio and adjust the tuning to obtain a maximum value of the noise power ratio. In this tuning condition, the system will operate with maximum signal/noise ratio.

Switch 140 is located after noise source 25. Switch 140 allows a lower value of noise power to coupling coil 60 when noise source 25 is in the cold state. Switch 140 is optional and other means of reducing noise power to coupling coil 60 may be employed and are within the scope of the present invention.

A commercial noise figure meter such as the Hewlett-Packard model no. 8970B is expensive and has substantial calibration features that are not required for regular operation with an MRI system. For regular use in an MRI system, the existing MRI receiver and computer system can be used to implement the band-pass filter, the noise power meter, and the computation of the ratio of hot and cold output noise powers. For use with the present invention, the computer system of the MRI receiver must be able to output a control bit to switch the noise source on and off and to compute the total received noise power for the on and off states. This noise power can be computed from two outputs of a quadrature detector system as shown in FIG. 7.

Figure 7:
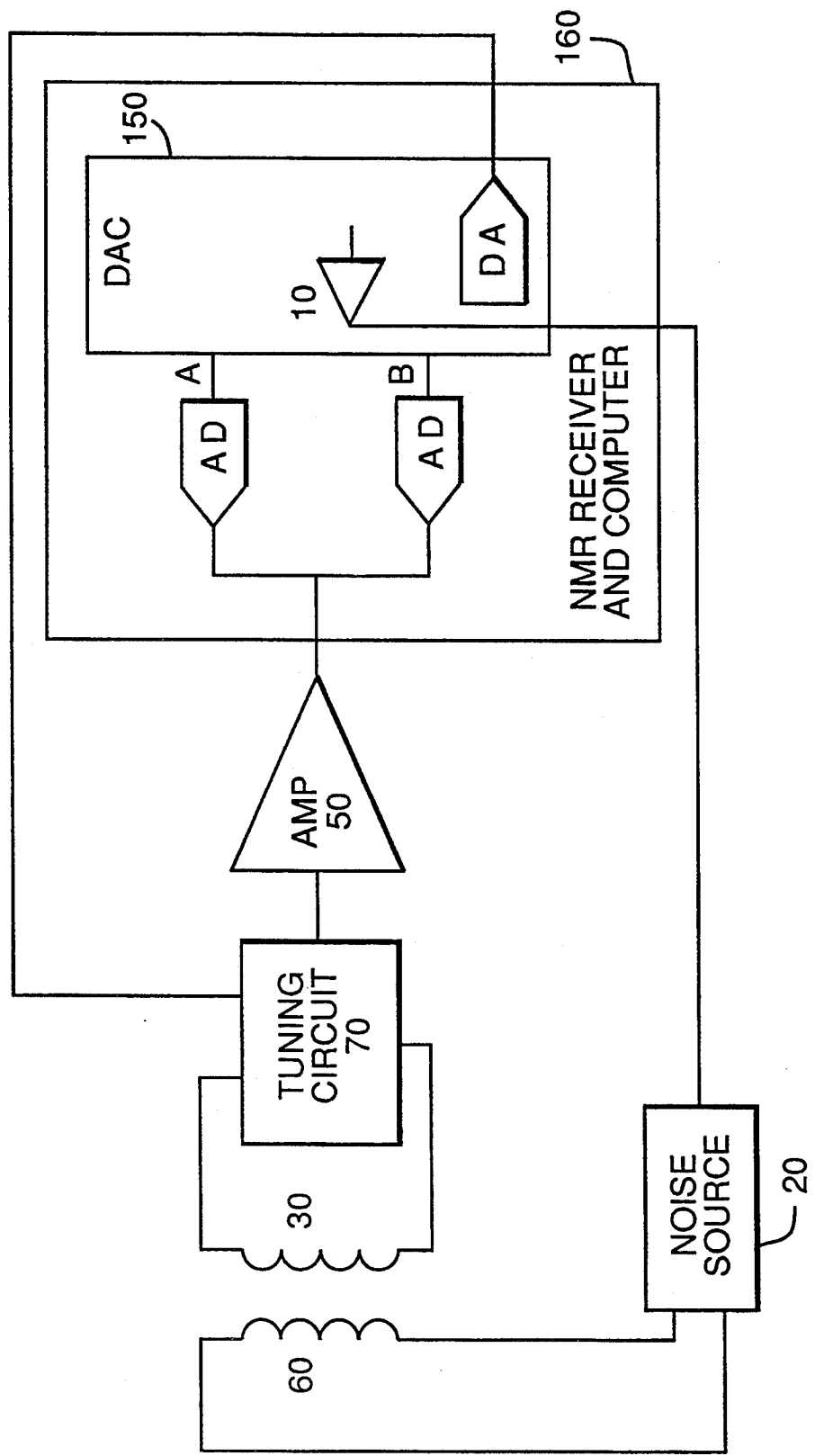
FIG. 7 is a functional block diagram illustrating the implementation of the signal/noise ratio optimization tuning system of the present invention using a typical NMR receiver system.

The NMR receiver and computer 160 for use in an MRI system shown in FIG. 7 has two data stream outputs, A and B, both of which are sampled by a digitizer at a regular sampling rate. The digitizer is part of the Data Acquisition Computation and Control System 150 of the NMR receiver and computer. The two data streams are bipolar numbers, being positive or negative. For random noise into receiver antenna 30, the noise power for each hot and cold state of noise source 20 is defined by the equation $P_n = s_A^2 + s_B^2$. The $s_A$ term is the standard deviation of a data sequence in the "A" channel of the NMR receiver and $s_B$ is the standard deviation of the same data sequence in the "B" channel. Because the data in the two channels are a random distribution about a small mean, the above definition must be used for an accurate measurement of the power with a normal quadrature receiver pair.

The computer in the NMR imaging system can also be used to adjust the tuning for best signal/noise ratio. For example, many NMR imaging system computers already have provision to adjust the tuning of the receiving antenna by means of voltage-controlled capacitor diodes or motor-controlled mechanical variable capacitors. These systems normally adjust the antenna tuning following an algorithm that maximizes the received signal power. Use of this algorithm may not yield the best signal/noise ratio. The same tuning algorithm can be used to maximize the ratio of hot and cold output noise powers computed from the digitized data, instead of maximizing the received signal power. This procedure can be used to adjust the receiver antenna tuning automatically.

The present invention may, therefore, be summarized as providing a signal/noise ratio optimization tuning system that can be used on any system of resonant antenna and amplifier with one tuning adjustment and that does not require disconnection for normal use of the receiver antenna.

It will be apparent to those skilled in the art that modifications and variations can be made in the signal/noise ratio optimization tuning system of the present invention. The invention in its broader aspects is, therefore, not limited to the specific details, representative methods and apparatus, and illustrated examples shown and described herein. Thus, it is intended that all matter contained in the foregoing description and shown in the accompanying drawings, shall be interpreted as illustrative and not in a limiting sense.

What is claimed is:

1. A signal/noise ratio optimization tuning system for tuning a receiver antenna circuit and amplifier comprising:

a switch-controlled noise source means weakly coupled to the receiver antenna circuit during tuning operations for switching a noise source between higher and lower power states at a predetermined frequency;

a noise power meter means synchronized to the switch-controlled noise source means for measuring outputs of the amplifier, wherein the noise power meter means measures the outputs of the amplifier when the noise source is switched between higher and lower power states and computes a ratio of the amplifier output with the noise source in the higher power state to the amplifier output with the noise source in the lower power state; and tuning adjustment means for tuning the receiver antenna circuit and amplifier to maximize the ratio of amplifier outputs with the noise source in the higher and lower power states by making an adjustment to the receiver antenna circuit.

2. The signal/noise ratio optimization tuning system as recited in claim 1 wherein the noise source is switched at a rate between 1 to 1000 Hz.

3. The signal/noise ratio optimization tuning system as recited in claim 1 wherein the noise power meter measures the noise at the amplifier output in an established narrow bandwidth centered on an operating frequency by a bandpass filter.

4. The signal/noise ratio optimization tuning system as recited in claim 1 wherein the noise power meter averages separately the amplifier outputs with the noise source in the higher and lower power states over time.

5. The signal/noise ratio optimization tuning system as recited in claim 1 wherein an amplifier amplifies the switch-controlled noise source.

6. The signal/noise ratio optimization tuning system as recited in claim 1 wherein the tuning system is used for tuning a receiver antenna circuit and amplifier in a Magnetic Resonance Imaging system.

7. The signal/noise ratio optimization tuning system as recited in claim 1 wherein the tuning adjustment means further comprises means to manually tune the receiver antenna circuit and amplifier to maximize the ratio of the amplifier outputs with the noise source in the higher and lower power states.

8. The signal/noise ratio optimization tuning system as recited in claim 7 wherein the tuning adjustment means further comprises an indicator for indicating the maximum value of the ratio of the amplifier outputs with the noise source in the higher and lower power states.

9. The signal/noise ratio optimization tuning system as recited in claim 1 wherein the tuning adjustment means further comprises means to automatically tune the receiver antenna circuit and amplifier to maximize the ratio of the amplifier outputs with the noise source in the higher and lower power states.

10. The signal/noise ratio optimization tuning system as recited in claim 6 wherein the Magnetic Resonance Imaging system comprises means for computing the ratio of the amplifier outputs with the noise source in the higher and lower power states.

11. The signal/noise ratio optimization tuning system as recited in claim 9 wherein the automatic means further comprises a computer system to implement an automatic control algorithm to obtain a maximum value of the ratio of the amplifier outputs with the noise source in the higher and lower power states.

12. The signal/noise ratio optimization tuning system as recited in claim 1 wherein the tuning adjustment means varies more than one component in the receiver antenna circuit.

13. The signal/noise ratio optimization tuning system as recited in claim 1 wherein the noise source is disabled from the receiver antenna circuit and amplifier when tuning operations of the receiver antenna circuit and amplifier are complete.

* * * * *